US007989289B2

(12) United States Patent  
Krishnamohan et al.

(10) Patent No.: US 7,989,289 B2  
(45) Date of Patent: Aug. 2, 2011

(54) FLOATING GATE STRUCTURES

(75) Inventors: Tejas Krishnamohan, Palo Alto, CA (US); Krishna Parat, Palo Alto, CA (US); Kyu Min, San Jose, CA (US); Srivardhan Gowda, Boise, ID (US); Thomas M. Graettinger, Boise, ID (US); Nirmal Ramaswamy, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 499 days.

(21) Appl. No.: 12/165,272

(22) Filed: Jun. 30, 2008

(65) Prior Publication Data

US 2009/0283817 A1 Nov. 19, 2009

Related U.S. Application Data

(60) Provisional application No. 61/052,958, filed on May 13, 2008.

(51) Int. Cl.
*H01L 21/336* (2006.01)
*H01L 29/788* (2006.01)

(52) U.S. Cl. ........................................ 438/260; 257/317

(58) Field of Classification Search .......... 257/315–322, 257/E27.078; 438/260, 265
See application file for complete search history.

(56) References Cited

U.S. PATENT DOCUMENTS

| 6,265,292 | B1 | 7/2001 | Parat et al. | |
|---|---|---|---|---|
| 6,518,618 | B1 | 2/2003 | Fazio et al. | |
| 6,812,515 | B2 * | 11/2004 | Rabkin et al. | 257/315 |
| 6,943,071 | B2 | 9/2005 | Fazio et al. | |
| 7,183,162 | B1 | 2/2007 | Soss et al. | |
| 7,187,591 | B2 | 3/2007 | Fastow et al. | |
| 7,485,526 | B2 * | 2/2009 | Mouli et al. | 438/257 |
| 7,745,874 | B2 * | 6/2010 | Lee et al. | 257/325 |
| 2009/0140317 | A1 * | 6/2009 | Rosmeulen | 257/316 |

OTHER PUBLICATIONS

Pangal, Kiran et al., "Enabling Flash Cell Scaling by Shaping of the Floating Gate Using Spacers", U.S. Appl. No. 11/728,829, filed Mar. 27, 2007.
Krishnamohan, Tejas et al., "Non-Volatile Memory Cell With Multi-Layer Blocking Dielectric", U.S. Appl. No. 11/771,482, filed Jun. 29, 2007.
Min, Kyu S., "Self-Aligned Charge-Trapping Layers for Non-Volatile Data Storage, Processes of Forming Same, and Devices Containing Same", U.S. Appl. No. 11/693,925, filed Mar 30, 2007.
Min, Kyu S., et al., "High-K Trilayer Dielectric Device and Methods", U.S. Appl. No. 11/694,059, filed Mar. 30, 2007.

* cited by examiner

*Primary Examiner* — Calvin Lee
(74) *Attorney, Agent, or Firm* — Cool Patent, P.C.; Joseph P. Curtin

(57) ABSTRACT

Floating gate structures are generally described. In one example, an electronic device includes a semiconductor substrate, a tunnel dielectric coupled with the semiconductor substrate, and a floating gate structure comprising at least a first region having a first electron energy level or electron workfunction or carrier capture efficiency coupled with the tunnel dielectric and a second region having a second electron energy level or electron workfunction or carrier capture efficiency coupled with the first region wherein the first electron energy level or electron workfunction or carrier capture efficiency is less than the second electron energy level or electron workfunction or carrier capture efficiency. Such electronic device may reduce the thickness of the floating gate structure or reduce leakage current through an inter-gate dielectric, or combinations thereof, compared with a floating gate structure that comprises only polysilicon.

18 Claims, 5 Drawing Sheets

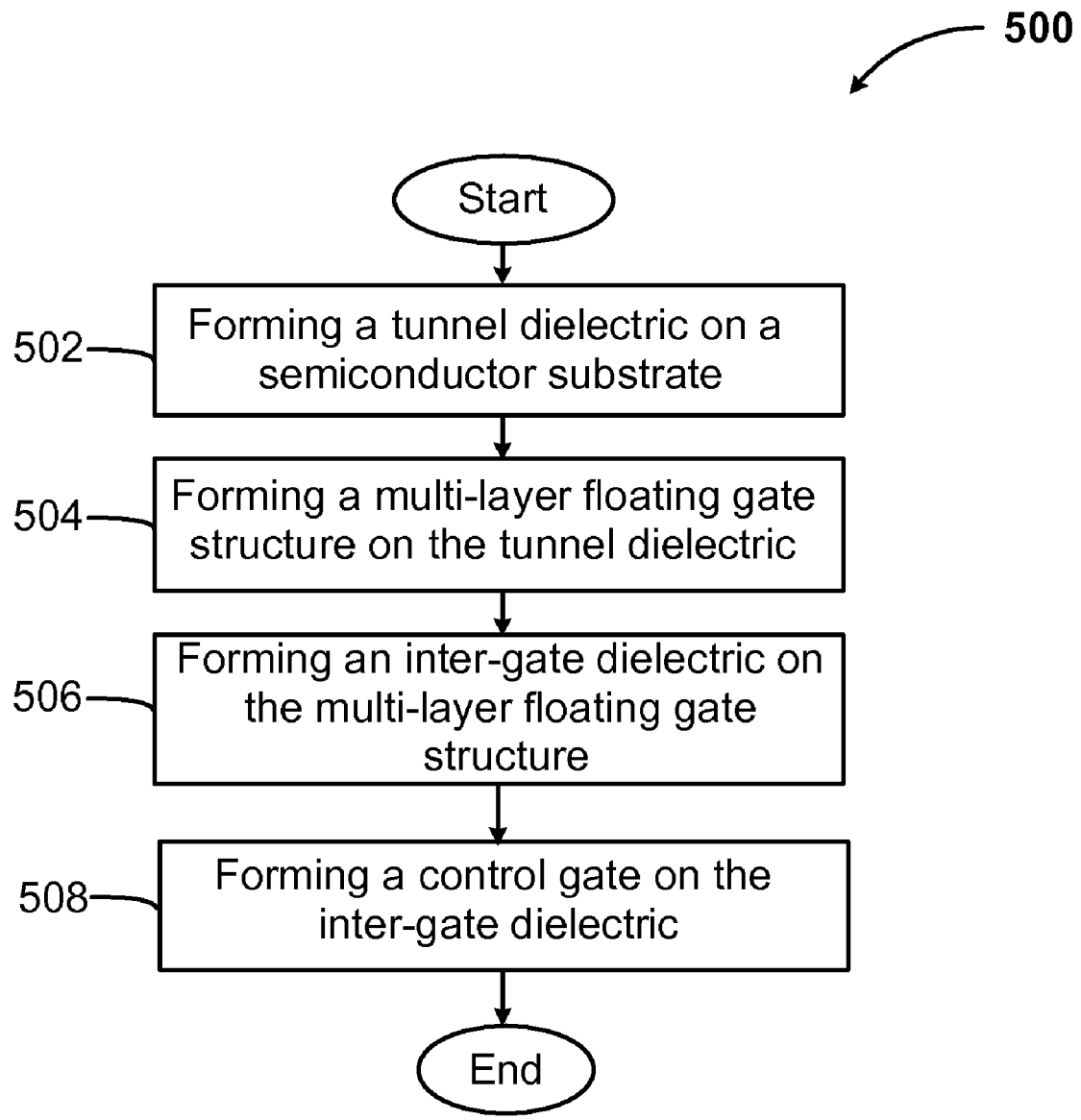

FLOATING GATE STRUCTURES

RELATED APPLICATIONS

This application claims the benefit of U.S. Provisional Application No. 61/052,958, filed May 13, 2008.

BACKGROUND

Generally, a floating gate structure may store charge in a memory device. A floating gate structure may be a charge-trap node.

BRIEF DESCRIPTION OF THE DRAWINGS

Embodiments disclosed herein are illustrated by way of example, and not by way of limitation, in the figures of the accompanying drawings in which like reference numerals refer to similar elements and in which:

FIG. 5 is a process flow diagram of a method for forming an electronic device comprising a floating gate structure as described herein, according to but one embodiment.

Figure 1:
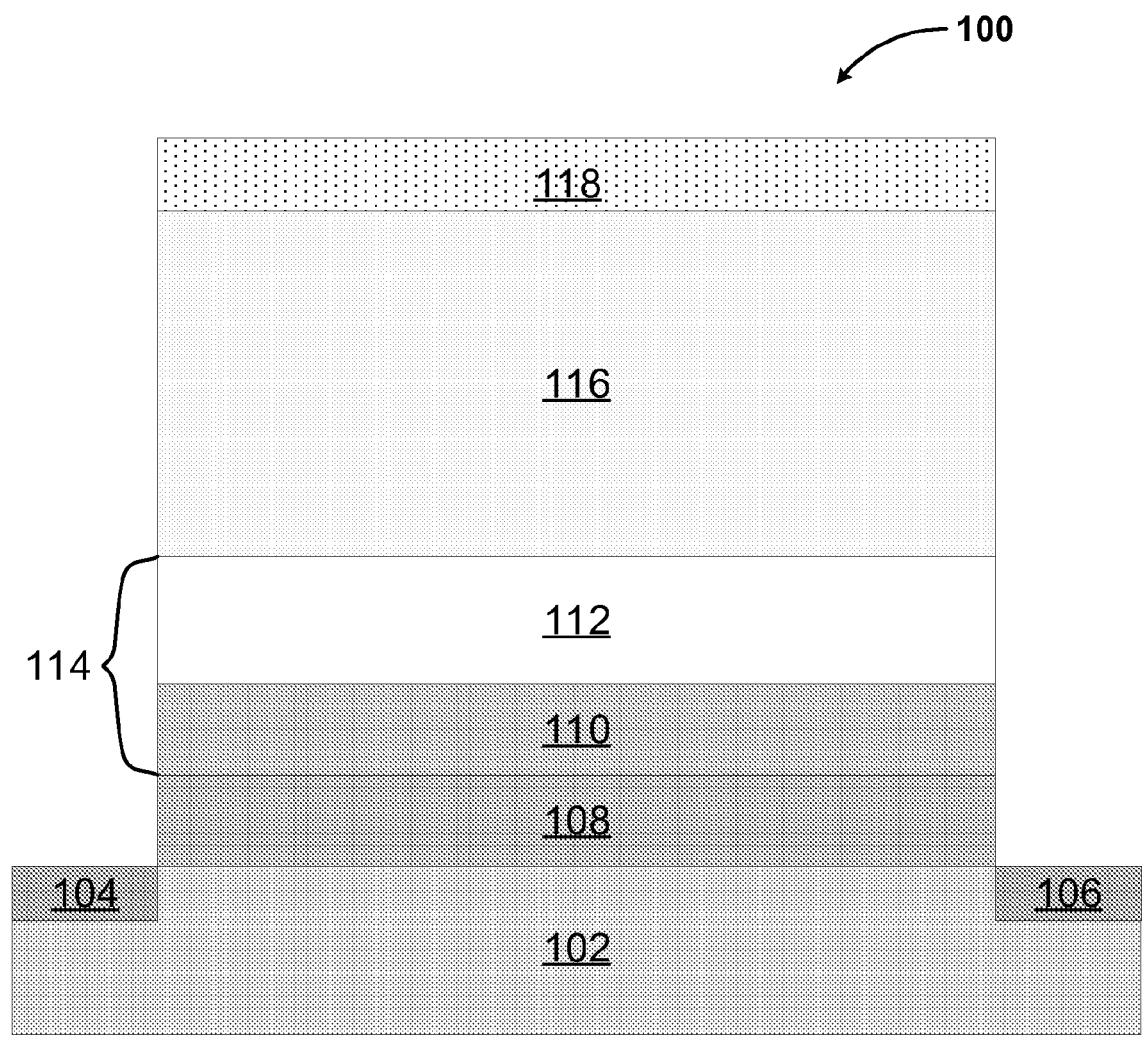
FIG. 1 is an elevation cross-section schematic of an electronic device comprising a floating gate structure, according to but one embodiment.

It will be appreciated that for simplicity and/or clarity of illustration, elements illustrated in the figures have not necessarily been drawn to scale. For example, the dimensions of some of the elements may be exaggerated relative to other elements for clarity. Further, if considered appropriate, reference numerals have been repeated among the figures to indicate corresponding and/or analogous elements.

DETAILED DESCRIPTION

Embodiments of floating gate structures are described herein. In the following description, numerous specific details are set forth to provide a thorough understanding of embodiments disclosed herein. One skilled in the relevant art will recognize, however, that the embodiments disclosed herein can be practiced without one or more of the specific details, or with other methods, components, materials, and so forth. In other instances, well-known structures, materials, or operations are not shown or described in detail to avoid obscuring aspects of the specification.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

FIG. 1 is an elevation cross-section schematic of an electronic device comprising a floating gate structure, according to but one embodiment. In an embodiment, electronic device 100 includes a semiconductor substrate 102, source 104 and drain 106 regions, tunnel dielectric 108, a floating gate structure 114 comprising at least a first region 110 and a second region 112, an inter-gate dielectric 116, and a control gate 118, coupled as shown. First region 110 may be a first layer and second region 112 may be a second layer in one embodiment. In another embodiment, first region 110 and second region 112 comprise regions of a single disparate layer wherein the first region 110 and second region 112 are distinguished by physical or electrical characteristics.

Embodiments described herein may describe an electronic device 100 comprising a multi-layer floating gate structure 114 that provides several benefits compared with an electronic device comprising a single polysilicon layer as a floating gate. Floating-gate (FG) technology may use a "floating" gate 114 to store charge. A floating gate 114 may be "floating" in the sense that a bottom portion of the floating gate is insulated by a tunnel dielectric 108 and a top portion of the floating gate is insulated by an inter-gate dielectric (IGD) 116, which may be referred to as inter-poly dielectric (IPD) or "blocking" dielectric in one or more embodiments. For example, a multi-layer floating gate structure 114 as described herein may increase electron capture efficiency in the floating gate 114, reduce parasitic interference between neighboring cells, increase the threshold voltage saturation windows for program and erase conditions, increase data retention without significantly degrading program and erase operations, increase integration feasibility and reliability of high-k IGD 116 by using an appropriate multi-layer stack of metal, metal nitride, metal silicide or polysilicon, and also enable planar floating gate geometry using high-k IGD 116.

In an embodiment, a multi-layer floating gate structure 114 comprises a bi-layer stack of a first layer 110 comprising a lower work-function metal, metal nitride, metal silicide, or appropriate n-type, p-type or undoped polysilicon layer, capped by a second layer 112 comprising a higher work-function metal, metal nitride, or metal silicide. In other embodiments, a floating gate structure 114 comprises a multi-layer stack of a combination of metal, metal nitride, metal silicide, or polysilicon having suitable electrical properties, or combinations thereof. The materials and/or thicknesses or other attributes for floating gate structure 114 may be selected for attributes, such as carrier relaxation time, electronic work function and thermal stability, for the metal, metal nitrides, and/or metal silicides, and/or doping concentration for the n-type or p-type polysilicon to provide suitable program, erase, retention and/or reliability properties in an electronic device 100. Second layer 112 may comprise a high work-function metal to increase data retention and increase the saturation window by lowering leakage through an IGD 116 comprising a high-k dielectric material. Having only the second layer 112 comprising high work-function metal, metal nitride, or metal silicide, may be difficult to erase due to the higher barrier height for electrons tunneling out from the second layer 112 through the tunnel oxide 108 to the substrate 102. A first layer 110 comprising a low work-function metal, metal nitride, metal silicide, or polysilicon in combination with the second layer 112 comprising a high work-function metal may ensure that the cell does not suffer from increased erase voltages required when using a high work-function metal. N-type polysilicon, for example, may exhibit a lower tunneling barrier with respect to the tunnel oxide 108.

As technology scales to smaller sizes including, for example, below about the 40 nanometer (nm) node of bit-line to bit-line half pitch, challenges may arise due to the close proximity of bit lines and word lines to one another. Aggressive reduction of the physical thickness of the floating gate structure 114, including, for example, a floating gate 114 comprising only polysilicon, may allow high-energy injected carriers to escape out of the floating gate 114 comprising only polysilicon, for example, without scattering and relaxing in energy in the polysilicon electrode 110, 112, potentially leading to increased gate leakage and/or IGD 116 damage. In an embodiment, an electronic device 100 comprises a floating gate structure 114 to overcome issues described in embodiments above. An electronic device 100 may comprise a semiconductor substrate 102, a tunnel dielectric 108 coupled with the semiconductor substrate 102, and a multi-layer floating gate structure 114 comprising at least a first layer 110 coupled with the tunnel dielectric 108 and a second layer 112 coupled with the first layer 110. The multi-layer floating gate structure 114 comprises a bi-layer stack of a first layer 110 comprising a lower work-function metal, metal nitride, metal silicide, or appropriate n-type, p-type or undoped polysilicon layer, capped by a second layer 112 comprising a higher work-function metal, metal nitride, or metal silicide. In other embodiments, a floating gate structure 114 comprises a multi-layer stack of a combination of metal, metal nitride, metal silicide, or polysilicon having suitable electrical properties, or combinations thereof. Such characteristic of a floating gate structure 114 may provide a variety of benefits. For example, a second layer 112 having a higher capture efficiency than a first layer 110 may prevent ballistic transport of high-energy carriers out of the floating gate 114 and increase the capture efficiency of the floating gate 114. Such effect may allow the reduction of thickness of the first layer 110 and reduce capacitive coupling between neighboring cells.

High-k dielectric materials may be used as an IGD 116. Such high-k dielectric materials may form unwanted interfacial compounds at an interface with, for example, polysilicon. For example, interfacial silicon oxide (SO2) may be formed, which may be adverse to IGD 116 performance. Also, interfaces between floating gate 114 electrode material, such as polysilicon and high-k dielectric materials of IGD 116, may display a "Fermi Level pinning" effect, which fixes the electronic barrier height between the floating or control gate 114 and the IGD 116, and may not be tunable by doping the polysilicon. The multi-layer floating gate structure 114 comprises a bi-layer stack of a first layer 110 comprising a lower work-function metal, metal nitride, metal silicide, or appropriate n-type, p-type or undoped polysilicon layer, capped by a second layer 112 comprising a higher work-function metal, metal nitride, or metal silicide. In other embodiments, a floating gate structure 114 comprises a multi-layer stack of a combination of metal, metal nitride, metal silicide, or polysilicon having suitable electrical properties, or combinations thereof. Such characteristic of a floating gate structure 114 may provide a variety of benefits. For example, choosing an appropriate second layer 112, with desired attributes, such as electronic work function and thermal stability prevents unwanted interaction between the high-k dielectrics used in IGD 116 and the polysilicon layer used, for example, in layer 110. Further, the first layer 110 may help in reducing the unwanted interaction between the second layer 112 and the tunnel dielectric 108. Thus the multi-layer floating gate stack 114 may improve the properties of electronic device 100.

A floating gate structure 114 may be a multi-layer floating gate (MFG) comprising, for example, a first layer 110 comprising polysilicon and a second layer 112 comprising a higher work function metal, a metal nitride, a metal silicide, a metal silicon nitride, a metal carbide, or a conductive metal oxide, or combinations thereof, in one embodiment. A first layer 110 comprising polysilicon may have a lower barrier height for carriers to tunnel out of the tunnel oxide 108 compared with a second layer 112 comprising a higher work function metal, which may keep erase voltages lower. The second layer 112 comprising a higher workfunction metal may have a higher barrier height for carriers to tunnel out of the IGD 116 compared to the first layer 110 comprising polysilicon, which may improve the data retention and the saturation windows of electronic device 100. The first layer 110 may comprise a thickness that is less than about 10 nm and the second layer 112 may comprise a thickness that is less than about 10 nm. Other thicknesses may be used in other embodiments. In an embodiment, capping a first layer 110 comprising polysilicon with a second layer 112 comprising a metal may prevent the ballistic transport of high-energy carriers out of the floating-gate and increase the capture efficiency of the floating node. In yet another embodiment, capping a first layer 110 comprising polysilicon with a second layer 112 comprising a metal may improve the thermal stability and the interfacial properties between the IGD 116 and the floating gate 114 as well as the tunnel oxide 108 and the floating gate 114.

A variety of different materials may be combined or used for first layer 110 and/or second layer 112 to provide benefits according to the principles already discussed. First layer 110 or second layer 112 may comprise, for example, polysilicon, a metal, a metal nitride, a metal silicide, a metal silicon nitride, a metal carbide, a metal carbon nitride, or a conductive metal oxide, or combinations thereof. In an embodiment, a metal comprises, for example, tungsten (W), titanium (Ti), tantalum (Ta), platinum (Pt), nickel (Ni), cobalt (Co), rhodium (Rh), ruthenium (Ru), palladium (Pd), hafnium (Hf), zirconium (Zr), or aluminum (Al), or combinations thereof. The metal nitride may comprise, for example, titanium nitride (TiN), tungsten nitride (WN), or tantalum nitride (TaN), or combinations thereof. The metal silicide may comprise, for example, titanium silicide (TiSi), tungsten silicide (WSi), tantalum silicide (TaSi), cobalt silicide (CoSi), platinum silicide (PtSi), nickel silicide (Nisi), or combinations thereof. The metal silicon nitride may comprise, for example, titanium silicon nitride (TiSiN), or tantalum silicon nitride (TaSiN), or combinations thereof. The metal carbide may comprise, for example, titanium carbide (TiC), zirconium carbide (ZrC), tantalum carbide (TaC), hafnium carbide (HfC), or aluminum carbide (AlC), or combinations thereof. The metal carbon nitride may comprise, for example, tantalum carbon nitride (TaCN), titanium carbon nitride (TiCN), or combinations thereof. A conductive metal oxide may comprise, for example, ruthenium oxide ($RuO_2$). Other material combinations are possible within the scope of the subject matter described herein. First layer 110 may comprise lower work-function metal and the second layer 112 may comprise higher work-function metals in an embodiment. Other analogous or similar materials may be used beyond those listed here in other embodiments. Materials for first layer 110 and second layer 112 may be selected to reduce the thickness of the floating gate structure or to reduce leakage current through the inter-gate dielectric 116, or combinations thereof, compared with a floating gate structure that comprises only polysilicon. In an embodiment, a first layer 110 comprises a thickness of less than about 10 nanometers (nm) and second layer 112 comprises a thickness of less than about 10 nm.

First layer 110 or second layer 112 may comprise n-type doped, p-type doped, or undoped polysilicon, or combinations thereof. In one embodiment, the first layer 110 comprises n-type doped polysilicon and the second layer 112 comprises p-type doped polysilicon. N-type doped polysilicon may have an electron energy level of about 4.1 electron-volts (eV) and p-type doped polysilicon may have an electron energy level of about 5.2 electron-volts (eV).

In an embodiment, a floating gate structure 114 comprising a second layer 112 including a metal may more readily integrate with an IGD 116 comprising a high-k dielectric than a floating gate structure comprising only polysilicon, for example, and provide a larger memory window and increased retention without significant degradation of device operation, such as program, erase, or read. In another embodiment, a floating gate structure 114 comprising a first layer 110 of polysilicon may integrate well with a tunnel dielectric 108.

Semiconductor substrate 102 may comprise silicon (Si) or any other suitable semiconductor material. Source 104 and drain 106 regions may comprise doped semiconductor substrate such as, for example, doped Si. In an embodiment, tunnel dielectric 108 comprises an oxide material. In another embodiment, the tunnel dielectric comprises silicon oxide ($SiO_2$), silicon oxynitride ($SiO_xN_y$), silicon nitride ($Si_xN_y$) aluminum oxide ($Al_2O_3$), or suitable combinations thereof, in which x and y represent suitable quantities of the respective elements. Tunnel dielectric 108 is not necessarily limited to these materials and may include other materials in other embodiments. For example, a tunnel dielectric 108 comprising $SiO_2$ may be coupled to a semiconductor substrate comprising Si and may include multiple layers and/or materials. In another embodiment, tunnel dielectric 108 comprises any form of dielectric that provides tunneling behavior of electrons or holes consistent with an electronic device 100. Tunnel dielectric 108 may comprise a thickness of about 3 to 10 nm effective oxide thickness (EOT) in one embodiment.

High-k dielectric materials may be used as an IGD 116 in one or more embodiments. In an embodiment, high-k dielectric includes any dielectric material comprising one or more layers of dielectric material wherein at least one layer comprises a dielectric constant, k, greater than about 7. In another embodiment, a high-k dielectric comprises silicon oxide ($SiO_2$), silicon oxynitride ($SiO_xN_y$), silicon nitride ($Si_xN_y$) aluminum oxide ($Al_2O_3$), hafnium oxide ($HfO_2$), hafnium aluminum oxide ($HfAl_xO_y$), hafnium silicon oxide ($HfSi_xO_y$), zirconium oxide ($ZrO_2$), zirconium silicon oxide ($ZrSi_xO_y$), lanthanum oxide ($La_2O_3$), yttrium oxide ($Y_2O_3$), lanthanum aluminum oxide ($LaAl_xO_y$), tantalum oxide ($Ta_2O_5$), titanium oxide ($TiO_2$), barium strontium titanium oxide ($BaSrTi_xO_y$), barium titanium oxide ($BaTi_xO_y$), strontium titanium oxide ($SrTi_xO_y$), lead scandium tantalum oxide ($PbSc_x$-$Ta_yO_z$), or lead zinc niobate ($PbZn_xNb_yO_z$), or suitable combinations thereof, in which x, y, and z represent suitable quantities of the respective elements. IGD 116 is not necessarily limited to these materials and may include other materials in other embodiments. In another embodiment, an IGD 116 comprises an EOT of about 3 to 10 nm. Layers of IGD 116 may be tuned to provide attributes, such as trap depths, trap densities, electron and hole barrier heights, and/or dielectric constant.

Electronic device 100 may further comprise a control gate 118 coupled with the inter-gate dielectric 116. In an embodiment, the control gate 118 comprises metal, metal nitride, metal silicide, metal silicon nitride, metal carbide, metal carbide nitride, or polysilicon, or combinations thereof. In another embodiment, control gate 118 comprises a higher work-function metal and/or doped p-type or n-type polysilicon, or suitable combinations thereof. Electronic device 100 may further comprise one or more isolation dielectric structures (not shown in FIG. 1) coupled with at least the semiconductor substrate 102 and the floating gate structure 114. One or more isolation dielectric structures may comprise shallow trench isolation (STI) pillars and may be shown and described further with respect to at least FIGS. 3-5.

Figure 2:
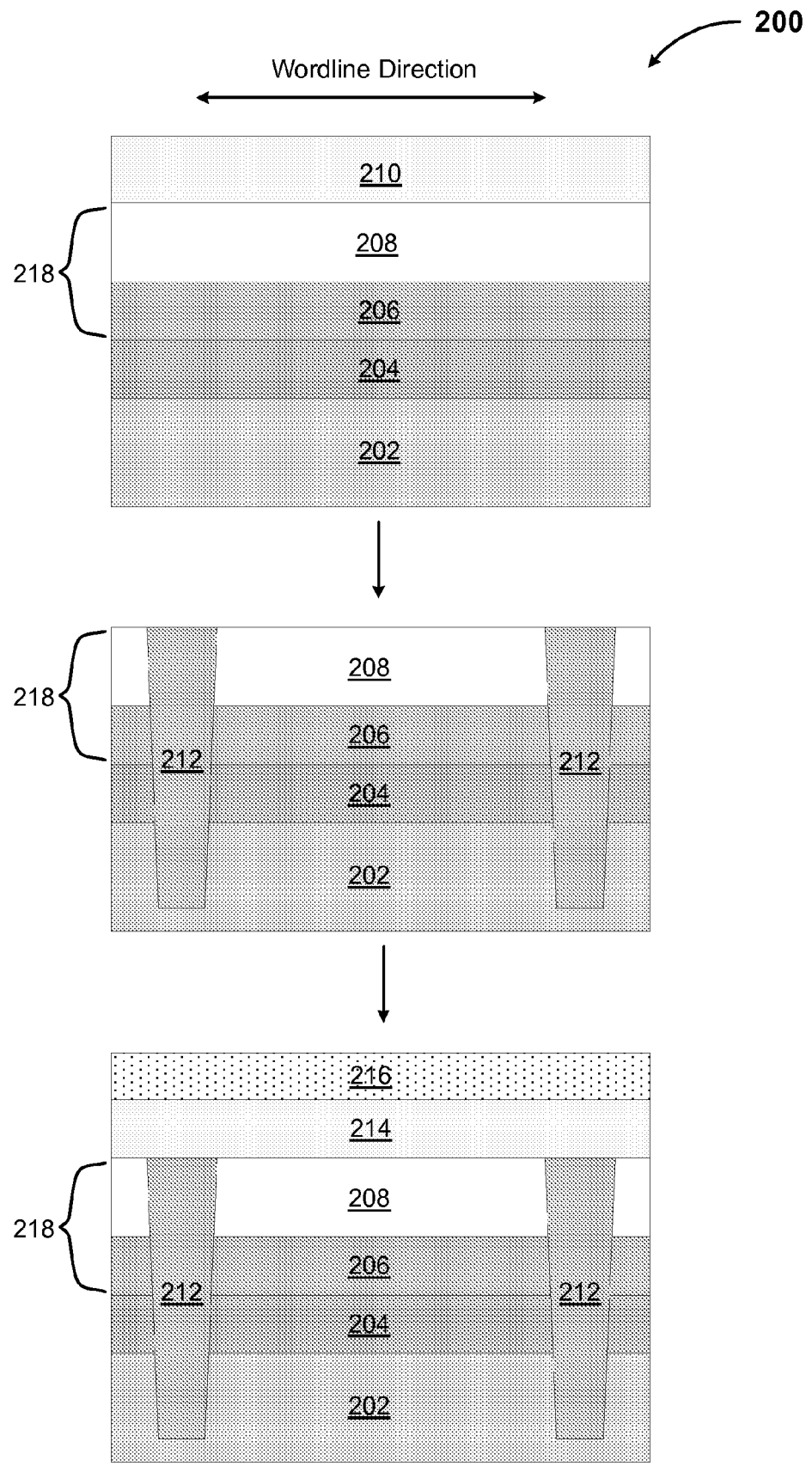
FIG. 2 is a schematic depicting a fabrication method of forming a floating gate structure, according to but one embodiment.

FIG. 2 is a schematic depicting a fabrication method of forming a floating gate structure, according to but one embodiment. In an embodiment, a fabrication method 200 of forming a floating gate structure 218 comprises forming a stack of layers 204, 206, 208, 210 on a semiconductor substrate 202. In an embodiment, an electronic device according to fabrication method 200 initially comprises a semiconductor substrate 202, tunnel dielectric 204, first layer 206 of floating gate structure 218, second layer 208 of floating gate structure 218, and a sacrificial layer 210, coupled as shown.

The initial stack of layers 204, 206, 208, 210 of method 200 may be formed by forming a tunnel dielectric 204 on a semiconductor substrate 202, and forming a floating gate structure 218 on the tunnel dielectric 204. Forming a tunnel dielectric 204 may comprise depositing or growing a tunnel dielectric 204 material on the semiconductor substrate 202. Forming a floating gate structure 218 on the tunnel dielectric 204 may comprise depositing a first layer 206 of a first material to the tunnel dielectric 204 and depositing a second layer 208 of a second material to the first layer 206.

Sacrificial layer 210 may be deposited to the floating gate structure 218. In an embodiment, method 200 comprises depositing a sacrificial layer 210 to the floating gate structure 218 to provide a stop layer for chemical mechanical polishing (CMP). The sacrificial layer 210 comprises $Si_3N_4$ in one embodiment, but may include any similar material that provides a similar function in other embodiments. Method 200 may further comprise patterning the sacrificial layer 210 to form one or more trenches in the floating gate structure 218, the tunnel dielectric 204, and the semiconductor substrate 202. Patterning may be accomplished by any suitable method including lithography and/or etch processes to selectively remove material from the stack of layers 202, 204, 206, 208, 210 to form one or more trenches for isolation dielectric 212.

Isolation dielectric 212 may be deposited to fill the one or more trenches formed by patterning, followed by polishing of the isolation dielectric 212 and removal of the sacrificial layer 210. Polishing includes any similar action that provides a similar function. In one embodiment, polishing includes chemical mechanical polishing. After polishing of the isolation dielectric 212 and removal of the sacrificial layer 210, an inter-gate dielectric 214 may be deposited to the floating gate structure 208 and a control gate 216 may be deposited to the inter-gate dielectric 214. Finally, word lines may be formed and may be in the direction indicated in FIG. 2. In an embodiment, method 200 uses a "self-aligned metal" approach with continuous inter-gate dielectric 214 in an electronic device. Deposition as described herein may include any suitable deposition method including chemical vapor deposition (CVD), physical vapor deposition (PVD), and/or atomic layer deposition (ALD) techniques among others.

Figure 3:
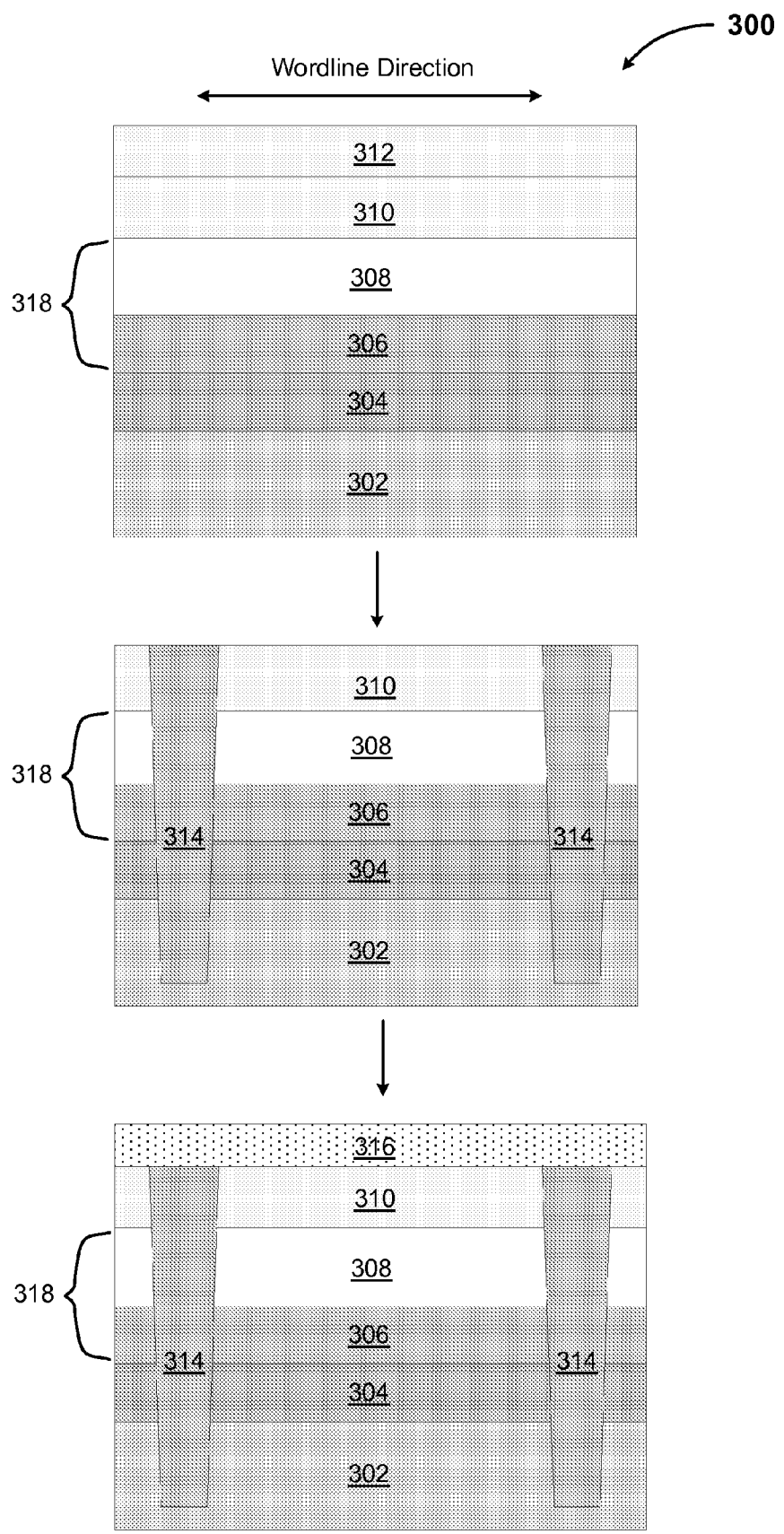
FIG. 3 is a schematic depicting another fabrication method of forming a floating gate structure, according to but one embodiment.

FIG. 3 is a schematic depicting another fabrication method of forming a floating gate structure, according to but one embodiment. In an embodiment, a fabrication method 300 of forming a floating gate structure 318 comprises forming a stack of layers 304, 306, 308, 310, 312 on a semiconductor substrate 302. In an embodiment, an electronic device according to fabrication method 300 initially comprises a semiconductor substrate 302, tunnel dielectric 304, first layer 306 of floating gate structure 318, second layer 308 of floating gate structure 318, inter-gate dielectric 310, and a sacrificial layer 312, coupled as shown.

The initial stack of layers 304, 306, 308, 310, 312 of method 300 may be formed by forming a tunnel dielectric 304 on a semiconductor substrate 302, and forming a floating gate structure 318 on the tunnel dielectric 304. Forming a tunnel dielectric 304 may comprise depositing or growing a tunnel dielectric 304 material on the semiconductor substrate 302. Forming a floating gate structure 318 on the tunnel dielectric 304 may comprise depositing a first layer 306 of a first material to the tunnel dielectric 304 and depositing a second layer 308 of a second material to the first layer 306.

Inter-gate dielectric 310 may be deposited to the floating gate structure 318 and sacrificial layer 312 may be deposited to the floating gate structure 318. In an embodiment, method 300 comprises depositing a sacrificial layer 312 to the inter-gate dielectric 310 to provide a stop layer for chemical mechanical polishing (CMP). The sacrificial layer 312 comprises $Si_3N_4$ in one embodiment, but may include any similar material that provides a similar function in other embodiments. Method 300 may further comprise patterning the sacrificial layer 312 to form one or more trenches in the inter-gate dielectric 310, the floating gate structure 318, the tunnel dielectric 304, and the semiconductor substrate 302. Patterning may be accomplished by any suitable method including lithography and/or etch processes to selectively remove material from the stack of layers 302, 304, 306, 308, 310, 312 to form one or more trenches for isolation dielectric 314.

Isolation dielectric 314 may be deposited to fill the one or more trenches formed by patterning, followed by polishing of the isolation dielectric 314 and removal of the sacrificial layer 312. Polishing includes any similar action that provides a similar function. In one embodiment, polishing includes chemical mechanical polishing. After polishing of the isolation dielectric 314 and removal of the sacrificial layer 312, a control gate 316 may be deposited to the inter-gate dielectric 310. Finally, word lines may be formed and may be in the direction indicated in FIG. 3. In an embodiment, method 300 uses a "self-aligned metal" approach with patterned inter-gate dielectric 310 in an electronic device. Deposition as described herein may include any suitable deposition method including chemical vapor deposition (CVD), physical vapor deposition (PVD), and/or atomic layer deposition (ALD) techniques among others.

Figure 4:
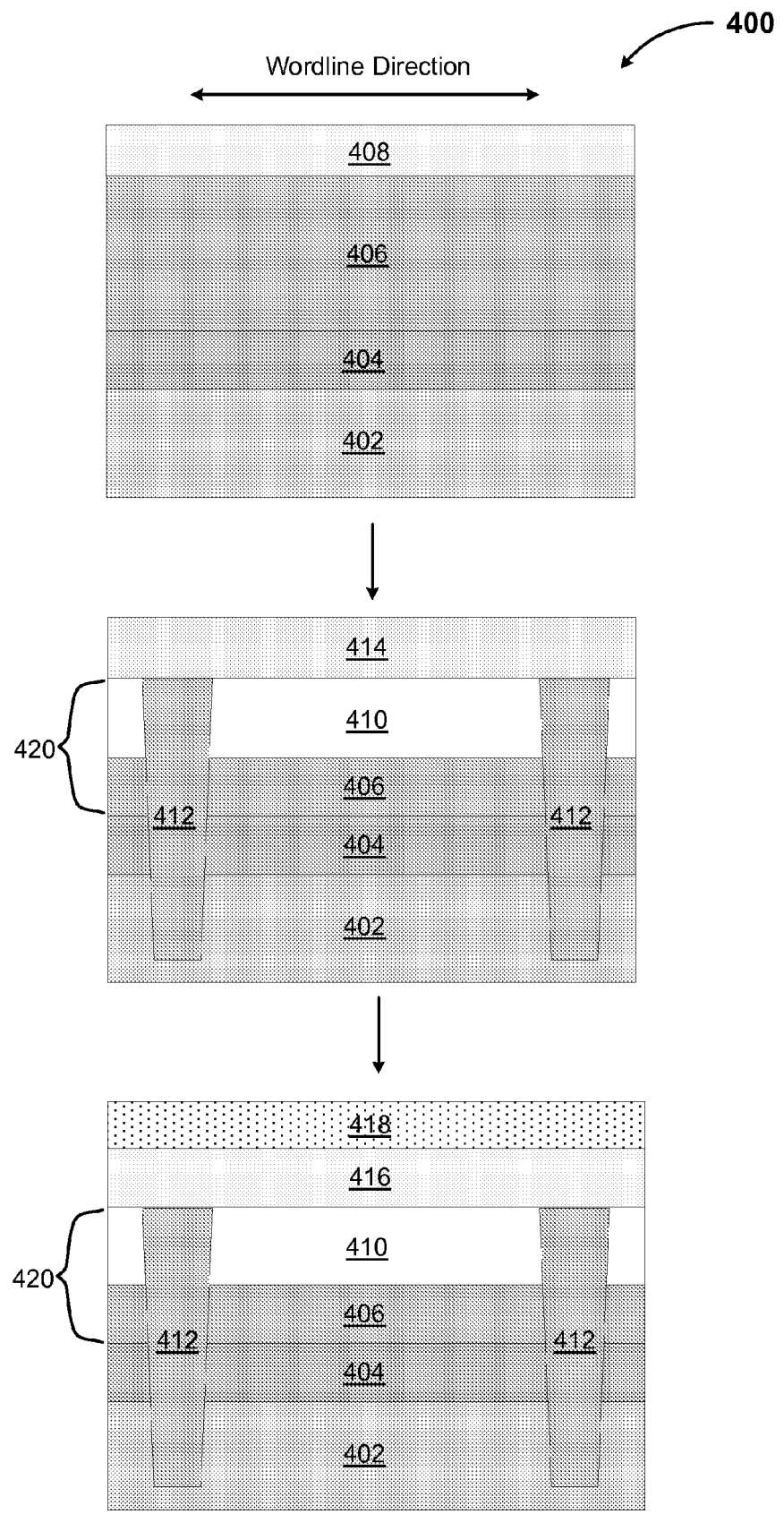
FIG. 4 is a schematic depicting yet another fabrication method of forming a floating gate structure, according to but one embodiment.

FIG. 4 is a schematic depicting yet another fabrication method of forming a floating gate structure, according to but one embodiment. In an embodiment, method 400 includes forming a stack of layers 404, 406, 408 on a semiconductor substrate 402. In an embodiment, an electronic device according to fabrication method 400 initially comprises a semiconductor substrate 402, tunnel dielectric 404, first layer 406 of floating gate structure 420, and a sacrificial layer 408, coupled as shown.

The initial stack of layers 404, 406, 408 of method 400 may be formed by forming a tunnel dielectric 404 on a semiconductor substrate 402. Forming a tunnel dielectric 404 may comprise depositing or growing a tunnel dielectric 404 material on the semiconductor substrate 402. A first layer 406 of a first material may be deposited to the tunnel dielectric 404 and sacrificial layer 408 may be deposited to the first layer 406. In an embodiment, the first material of the first layer 406 comprises polysilicon to allow silicidation of the first material to form a second layer 410.

In an embodiment, method 400 comprises depositing a sacrificial layer 408 to the first layer 406 to provide a stop layer for chemical mechanical polishing (CMP). The sacrificial layer 408 comprises $Si_3N_4$ in one embodiment, but may include any similar material that provides a similar function in other embodiments. Method 400 may further comprise patterning the sacrificial layer 408 to form one or more trenches in at least the first layer 406 of the floating gate structure 420, the tunnel dielectric 404, and the semiconductor substrate 402. Patterning may be accomplished by any suitable method including lithography and/or etch processes to selectively remove material from the stack of layers 402, 404, 406 to form one or more trenches for isolation dielectric 412.

Isolation dielectric 412 may be deposited to fill the one or more trenches formed by patterning, followed by polishing of the isolation dielectric 412 and removal of the sacrificial layer 408. Polishing includes any similar action that provides a similar function. In one embodiment, polishing includes chemical mechanical polishing. After polishing of the isolation dielectric 412 and removal of the sacrificial layer 408, a metal may be deposited to the first layer 406 to form the second layer 410 of the floating gate 420 by silicidation of a portion of the first material of the first layer 406. Silicidation may comprise salicidation in an embodiment wherein "salicidation" refers to self-aligned silicidation. A thermal process may be applied to silicidize a portion of the first layer 406 to form a second layer 410.

Silicidation may be followed by removal of unreacted metal. Silicidation may also be followed by surface treatments of the second layer 410 of the floating gate structure 420. In an embodiment, the silicide material of the second layer 410 is nitridized to form metal silicon nitrides. For example, in an embodiment in which a tantalum silicide (TaSi$_x$) is formed for second layer 410, a surface treatment of nitridization via direct plasma or NH$_3$ anneal, for example, may be applied to convert surface material of second layer 410 to tantalum silicon nitride (TaSiN). Surface nitridization may provide a more inert surface to prevent subsequent reaction between the silicide of second layer 410 and inter-gate dielectric 416, which may comprise a high-k dielectric.

An inter-gate dielectric 416 material may be deposited to the second layer 410 and a control gate 418 may be deposited to the inter-gate dielectric 416. Finally, word lines may be formed and may be in the direction indicated in FIG. 4. In an embodiment, method 400 uses a "salicided" floating gate approach with continuous inter-gate dielectric 416 in an electronic device. Deposition as described herein may include any suitable deposition method including chemical vapor deposition (CVD), physical vapor deposition (PVD), and/or atomic layer deposition (ALD) techniques among others.

FIG. 5 is a process flow diagram of a method for forming an electronic device comprising a floating gate structure as described herein, according to but one embodiment. In an embodiment, method 500 comprises forming a tunnel dielectric on a semiconductor substrate at box 502, forming a multi-layer floating gate structure on the tunnel dielectric at box 504, forming an inter-gate dielectric on the multi-layer floating gate structure at box 506, and forming a control gate on the inter-gate dielectric at box 508. Forming a tunnel dielectric on a semiconductor substrate 502 may comprise depositing or growing a tunnel dielectric material on the semiconductor substrate.

Forming a multi-layer floating gate structure on the tunnel dielectric 504 may comprise forming a floating gate structure on the tunnel dielectric, the floating gate structure comprising at least a first layer having a first electron energy level or electron work function coupled with the tunnel dielectric and a second layer having a second electron energy level or electron work function coupled with the first layer wherein the first electron energy level or electron work function is less than the second electron energy level or electron work function. In another embodiment, forming a floating gate structure on the tunnel dielectric 504 comprises depositing the first layer to the tunnel dielectric wherein the first layer comprises polysilicon, a metal, a metal nitride, a metal silicide, a metal silicon nitride, a metal carbide, a metal carbon nitride, or a conductive metal oxide, or combinations thereof and depositing the second layer to the first layer wherein the second layer comprises polysilicon, a metal, a metal nitride, a metal silicide, a metal silicon nitride, a metal carbide, a metal carbon nitride, or a conductive metal oxide, or combinations thereof, to reduce the thickness of the floating gate structure or to reduce leakage current through an inter-gate dielectric, or combinations thereof, compared with a floating gate structure that comprises only polysilicon.

In an embodiment, forming a floating gate structure on the tunnel dielectric 504 comprises depositing the first layer of the floating gate structure to the tunnel dielectric. The first layer comprises polysilicon and has a thickness of less than about 10 nanometers in one embodiment. Forming a floating gate structure on the tunnel dielectric 504 may further comprise forming the second layer of the floating gate structure wherein the second layer is coupled to the first layer. The second layer may be formed, for example, by silicidation or deposition in one or more embodiments. In an embodiment, the second layer comprises a metal, a metal nitride, a metal silicide, a metal silicon nitride, a metal carbide, a metal carbon nitride, or a conductive metal oxide, or combinations thereof, the second layer having a thickness of less than about 10 nanometers.

Method 500 may comprise a silicidation approach to form the second layer of a floating gate structure. In an embodiment, forming the floating gate structure on the tunnel dielectric 504 comprises depositing the first layer of the floating gate structure to the tunnel dielectric wherein the first layer comprises polysilicon, depositing a sacrificial layer to the first layer to provide a stop layer for chemical mechanical polishing (CMP), patterning the sacrificial layer to form one or more trenches in at least the first layer of the floating gate structure, the tunnel dielectric, and the semiconductor substrate, depositing an isolation dielectric to fill the one or more trenches, polishing the isolation dielectric, removing the sacrificial layer, and depositing a metal to the first layer to form the second layer of the floating gate by silicidation of a portion of the polysilicon of the first layer.

Method 500 may comprise a self-aligned metal approach with continuous inter-gate dielectric. In an embodiment, method 500 comprises depositing a sacrificial layer to the floating gate structure to provide a stop layer for chemical mechanical polishing (CMP), patterning the sacrificial layer to form one or more trenches in the floating gate structure, the tunnel dielectric, and the semiconductor substrate, depositing an isolation dielectric to fill the one or more trenches, polishing the isolation dielectric, removing the sacrificial layer. Method 500 may further comprise depositing an inter-gate dielectric to the floating gate structure 506, and depositing a control gate material to the inter-gate dielectric 508.

Method 500 may comprise a self-aligned metal approach with patterned inter-gate dielectric. In an embodiment, method 500 comprises depositing an inter-gate dielectric to the floating gate structure, depositing a sacrificial layer to the inter-gate dielectric to provide a stop layer for chemical mechanical polishing (CMP), patterning the sacrificial layer to form one or more trenches in the inter-gate dielectric, the floating gate structure, the tunnel dielectric, and the semiconductor substrate, depositing an isolation dielectric to fill the one or more trenches, polishing the isolation dielectric, and removing the sacrificial layer. Method 500 may further comprise depositing a control gate material to the inter-gate dielectric 508.

Forming an inter-gate dielectric on the floating gate structure 506 may comprise depositing an inter-gate dielectric material to the floating gate structure. In an embodiment, an inter-gate dielectric material comprises silicon oxide ($SO_2$), silicon oxynitride ($SiO_xN_y$), silicon nitride ($Si_xN_y$) aluminum oxide ($Al_2O_3$), hafnium oxide ($HfO_2$), hafnium aluminum oxide ($HfAl_xO_y$), hafnium silicon oxide ($HfSi_xO_y$), zirconium oxide ($ZrO_2$), zirconium silicon oxide ($ZrSi_xO_y$), lanthanum oxide ($La_2O_3$), yttrium oxide ($Y_2O_3$), lanthanum aluminum oxide ($LaAl_xO_y$), tantalum oxide ($Ta_2O_5$), titanium oxide ($TiO_2$), barium strontium titanium oxide ($BaSrTi_xO_y$), barium titanium oxide ($BaTi_xO_y$), strontium titanium oxide ($SrTi_xO_y$), lead scandium tantalum oxide ($PbSc_xTa_yO_z$), or lead zinc niobate ($PbZn_xNb_yO_z$), or combinations thereof, in which x, y, and z represent suitable quantities of the respective elements.

Forming a control gate on the inter-gate dielectric 508 may comprise depositing a control gate material to the inter-gate dielectric. In an embodiment, a control gate material comprises metal, metal nitride, metal silicide, or polysilicon, or combinations thereof.

Other methods to fabricate an electronic device comprising a floating gate structure as described herein may be used in other embodiments. Methods to fabricate an electronic device comprising a floating gate structure as described herein may further include other semiconductor fabrication processes such as lithography, etch, thin films deposition, planarization, diffusion, metrology, or any other associated action with semiconductor fabrication.

Various operations may be described as multiple discrete operations in turn, in a manner that is most helpful in understanding the claimed subject matter. The order of description should not, however, be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

The above description of illustrated embodiments, including what is described in the Abstract, is not intended to be exhaustive or to limit to the precise forms disclosed. While specific embodiments and examples are described herein for illustrative purposes, various equivalent modifications are possible within the scope of this description, as those skilled in the relevant art will recognize.

These modifications can be made in light of the above detailed description. The terms used in the following claims should not be construed to limit the scope to the specific embodiments disclosed in the specification and the claims. Rather, the scope of the embodiments disclosed herein is to be determined by the following claims, which are to be construed in accordance with established doctrines of claim interpretation.

What is claimed is:

1. A method, comprising:

forming a tunnel dielectric on a semiconductor substrate; and forming a floating gate structure on the tunnel dielectric, the floating gate structure comprising at least a first region having a first electron energy level or electron work function or carrier capture efficiency coupled with the tunnel dielectric and a second region having a second electron energy level or electron work function or carrier capture efficiency coupled with the first region wherein the first electron energy level or electron work function or carrier capture efficiency is less than the second electron energy level or electron work function or carrier capture efficiency, wherein forming the floating gate structure on the tunnel dielectric comprises:
  depositing a first layer of the floating gate structure to the tunnel dielectric wherein the first layer comprises polysilicon to form the first region;
  depositing a sacrificial layer to the first layer to provide a stop layer for chemical mechanical polishing (CMP);
  patterning the sacrificial layer to form one or more trenches in at least the first layer of the floating gate structure, the tunnel dielectric, and the semiconductor substrate;
  depositing an isolation dielectric to fill the one or more trenches;
  polishing the isolation dielectric;
  removing the sacrificial layer; and
  depositing a metal to the first layer to form the second region of the floating gate by silicidation of a portion of the polysilicon of the first layer.

2. A method according to claim 1, wherein forming the floating gate structure on the tunnel dielectric comprises:
  depositing a first layer to the tunnel dielectric to form the first region wherein the first layer comprises polysilicon, a metal, a metal nitride, a metal silicide, a metal silicon nitride, a metal carbide, a metal carbon nitride, or a conductive metal oxide, or combinations thereof; and
  depositing a second layer to the first layer to form the second region wherein the second layer comprises polysilicon, a metal, a metal nitride, a metal silicide, a metal silicon nitride, a metal carbide, a metal carbon nitride, or a conductive metal oxide, or combinations thereof, to reduce a thickness of the floating gate structure or to reduce leakage current through an inter-gate dielectric, or combinations thereof, compared with a floating gate structure that comprises only polysilicon.

3. A method according to claim 1, further comprising:
  depositing a sacrificial layer to the floating gate structure to provide a stop layer for chemical mechanical polishing (CMP);
  patterning the sacrificial layer to form one or more trenches in the floating gate structure, the tunnel dielectric, and the semiconductor substrate;
  depositing an isolation dielectric to fill the one or more trenches;
  polishing the isolation dielectric;
  removing the sacrificial layer;
  depositing an inter-gate dielectric to the floating gate structure; and
  depositing a control gate material to the inter-gate dielectric.

4. A method according to claim 1, wherein forming a floating gate structure on the tunnel dielectric comprises:
  depositing a first layer of the floating gate structure to the tunnel dielectric to form the first region, the first layer comprising polysilicon and having a thickness of less than about 10 nanometers; and
  forming the second region of the floating gate structure by depositing a second layer to the first layer or by silicidation of a portion of the first layer wherein the second region comprises a metal, a metal nitride, a metal silicide, a metal silicon nitride, a metal carbide, a metal carbon nitride, or a conductive metal oxide, or combinations thereof, the second region having a thickness of less than about 10 nanometers.

5. A method according to claim 1, further comprising:
  forming an inter-gate dielectric on the floating gate structure; and
  forming a control gate on the inter-gate dielectric.

6. A method according to claim 1, wherein forming an inter-gate dielectric comprises depositing an inter-gate dielectric material to the floating gate structure wherein the inter-gate dielectric material comprises silicon oxide ($SiO_2$), silicon oxynitride ($SiO_xN_y$), silicon nitride ($Si_xN_y$) aluminum oxide ($Al_2O_3$), hafnium oxide ($HfO_2$), hafnium aluminum oxide ($HfAl_xO_y$), hafnium silicon oxide ($HfSi_xO_y$), zirconium oxide ($ZrO_2$), zirconium silicon oxide ($ZrSi_xO_y$), lanthanum oxide ($La_2O_3$), yttrium oxide ($Y_2O_3$), lanthanum aluminum oxide ($LaAl_xO_y$), tantalum oxide ($Ta_2O_5$), titanium oxide ($TiO_2$), barium strontium titanium oxide ($BaSrTi_xO_y$), barium titanium oxide ($BaTi_xO_y$), strontium titanium oxide ($SrTi_xO_y$), lead scandium tantalum oxide ($PbSc_xTa_yO_z$), or lead zinc niobate ($PbZn_xNb_yO_z$), or combinations thereof, in which x, y, and z represent suitable quantities of the respective elements, wherein the tunnel dielectric comprises silicon oxide ($SiO_2$), silicon oxynitride ($SiO_xN_y$), silicon nitride ($Si_xN_y$) aluminum oxide ($Al_2O_3$), hafnium oxide ($HfO_2$), hafnium aluminate ($HfAl_xO_y$), hafnium silicon oxide ($HfSi_xO_y$) or combinations thereof, in which x, y, and z represent suitable quantities of the respective elements, and wherein forming a control gate on the inter-gate dielectric comprises depositing a control gate material to the inter-gate dielectric wherein the control gate material comprises metal, metal nitride, metal silicide, or polysilicon, or combinations thereof.

7. A method, comprising:
  forming a tunnel dielectric on a semiconductor substrate;
  forming a floating gate structure on the tunnel dielectric, the floating gate structure comprising at least a first region having a first electron energy level or electron work functionworkfunction or carrier capture efficiency coupled with the tunnel dielectric and a second region having a second electron energy level or electron work functionworkfunction or carrier capture efficiency coupled with the first region wherein the first electron energy level or electron work functionworkfunction or carrier capture efficiency is less than the second electron energy level or electron work functionworkfunction or carrier capture efficiency;
  depositing an inter-gate dielectric to the floating gate structure;
  depositing a sacrificial layer to the inter-gate dielectric to provide a stop layer for chemical mechanical polishing (CMP);
  patterning the sacrificial layer to form one or more trenches in the inter-gate dielectric, the floating gate structure, the tunnel dielectric, and the semiconductor substrate;
  depositing an isolation dielectric to fill the one or more trenches;
  polishing the isolation dielectric;
  removing the sacrificial layer; and
  depositing a control gate material to the inter-gate dielectric.

8. An apparatus, comprising:
  a semiconductor substrate;
  a tunnel dielectric coupled with the semiconductor substrate; and
  a floating gate structure comprising at least a first region having a first electron energy level or electron work function or carrier capture efficiency coupled with the tunnel dielectric and a second region having a second electron energy level or electron work function or carrier capture efficiency coupled with the first region, the first electron energy level or electron work function or carrier capture efficiency being less than the second electron energy level or electron work function or carrier capture efficiency, the floating gate structure being formed on the tunnel dielectric by depositing a first layer of the floating gate structure to the tunnel dielectric, the first layer comprising polysilicon to form the first region, depositing a sacrificial layer to the first layer to provide a stop layer for chemical mechanical polishing (CMP), patterning the sacrificial layer to form one or more trenches in at least the first layer of the floating gate structure, the tunnel dielectric, and the semiconductor substrate, depositing an isolation dielectric to fill the one or more trenches; polishing the isolation dielectric, removing the sacrificial layer, and depositing a metal to the first layer to form the second region of the floating gate by silicidation of a portion of the polysilicon of the first layer.

9. An apparatus according to claim 8, wherein the first region or the second region of the floating gate structure comprises polysilicon, a metal, a metal nitride, a metal silicide, a metal silicon nitride, a metal carbide, a metal carbon nitride, or a conductive metal oxide, or combinations thereof, to reduce a thickness of the floating gate structure or to reduce leakage currents through an inter-gate dielectric, or combinations thereof, compared with a floating gate structure that comprises only polysilicon.

10. An apparatus according to claim 9, wherein the polysilicon comprises n-type doped, p-type doped, or undoped polysilicon, or combinations thereof, the metal comprises tungsten (W), titanium (Ti), tantalum (Ta), platinum (Pt), nickel (Ni), cobalt (Co), rhodium (Rh), ruthenium (Ru), palladium (Pd), hafnium (Hf), zirconium (Zr), or aluminum (Al), or combinations thereof, the metal nitride comprises titanium nitride (TiN), tungsten nitride (WN), tantalum nitride (TaN), or combinations thereof, the metal silicide comprises titanium silicide (TiSi), tungsten silicide (WSi), tantalum silicide (TaSi), cobalt silicide (CoSi), platinum silicide (PtSi), nickel silicide (NiSi), or combinations thereof, and the metal silicon nitride comprises titanium silicon nitride (TiSiN), tantalum silicon nitride (TaSiN), or combinations thereof, the metal carbide comprises titanium carbide (TiC), zirconium carbide (ZrC), tantalum carbide (TaC), hafnium carbide (HfC), or aluminum carbide (AlC), or combinations thereof, the metal carbon nitride comprises tantalum carbon nitride (TaCN), or titanium carbon nitride (TiCN), or combinations thereof.

11. An apparatus according to claim 9, wherein the first region comprises n-type doped polysilicon and the second region comprises p-type doped polysilicon.

12. An apparatus according to claim 8, wherein the first region or the second region of the floating gate structure comprises polysilicon, a metal, a metal nitride, a metal silicide, a metal silicon nitride, a metal carbide, a metal carbon nitride, or a conductive metal oxide, or combinations thereof, to lower erase voltages of the floating gate structure by increasing tunneling probability through the tunnel dielectric compared with a floating gate structure that comprises only a single layer of a metal, a metal nitride, a metal silicide, a metal silicon nitride, a metal carbon nitride or a conductive metal oxide.

13. An apparatus according to claim 8, wherein the first region or the second region of the floating gate structure comprises polysilicon, a metal, a metal nitride, a metal silicide, a metal silicon nitride, a metal carbide, a metal carbon nitride, or a conductive metal oxide, or combinations thereof, to reduce harmful interfacial interactions between the first region and an inter-gate dielectric coupled with the floating gate structure, or between the second region and the tunnel dielectric, or combinations thereof, compared with a floating gate structure that comprises only polysilicon.

14. An apparatus according to claim 8, wherein the first region or the second region of the floating gate structure comprises polysilicon, a metal, a metal nitride, a metal silicide, a metal silicon nitride, a metal carbide, a metal carbon nitride, or a conductive metal oxide, or combinations thereof, to lower erase voltages, or to increase threshold voltage saturation windows for program and erase conditions, or combinations thereof, by providing a richer source of free electrons in the floating gate structure compared to a floating gate structure that comprises only polysilicon.

15. An apparatus according to claim 8, wherein the first region or the second region of the floating gate structure comprises polysilicon, a metal, a metal nitride, a metal silicide, a metal silicon nitride, a metal carbide, a metal carbon nitride, or a conductive metal oxide, or combinations thereof, to reduce leakage through an inter-gate dielectric coupled with the floating gate structure, or to increase threshold voltage saturation windows for program and erase conditions, or to increase data retention of a memory device, or combinations thereof, due to a higher work function or electron energy level in the floating gate structure compared to a floating gate structure that comprises only polysilicon.

16. An apparatus according to claim 8, wherein the first region of the floating gate structure comprises n-type, p-type, or undoped polysilicon, and wherein the second region of the floating gate structure comprises a metal, a metal nitride, a metal silicide, a metal silicon nitride, a metal carbide, a metal carbon nitride, or a conductive metal oxide, or combinations thereof.

17. An apparatus according to claim 8, further comprising:
an inter-gate dielectric coupled with the floating gate structure;
a control gate coupled with the inter-gate dielectric; and
one or more isolation dielectric structures coupled with at least the semiconductor substrate and the floating gate structure.

18. An apparatus according to claim 17, wherein the inter-gate dielectric comprises silicon oxide ($SiO_2$), silicon oxynitride ($SiO_xN_y$), silicon nitride ($Si_xN_y$) aluminum oxide ($Al_2O_3$), hafnium oxide ($HfO_2$), hafnium aluminum oxide ($HfAl_xO_y$), hafnium silicon oxide ($HfSi_xO_y$), zirconium oxide ($ZrO_2$), zirconium silicon oxide ($ZrSi_xO_y$), lanthanum oxide ($La_2O_3$), yttrium oxide ($Y_2O_3$), lanthanum aluminum oxide ($LaAl_xO_y$), tantalum oxide ($Ta_2O_5$), titanium oxide ($TiO_2$), barium strontium titanium oxide ($BaSrTi_xO_y$), barium titanium oxide ($BaTi_xO_y$), strontium titanium oxide ($SrTi_xO_y$), lead scandium tantalum oxide ($PbSc_xTa_yO_z$), or lead zinc niobate ($PbZn_xNb_yO_z$), or combinations thereof, in which x, y, and z represent suitable quantities of the respective elements, wherein the tunnel dielectric comprises silicon oxide ($SiO_2$), silicon oxynitride ($SiO_xN_y$), silicon nitride ($Si_xN_y$) aluminum oxide ($Al_2O_3$), hafnium oxide ($HfO_2$), hafnium aluminate ($HfAl_xO_y$), hafnium silicon oxide ($HfSi_xO_y$) or combinations thereof, in which x, y, and z represent suitable quantities of the respective elements, and wherein the control gate comprises metal, metal nitride, metal silicide, or polysilicon, or combinations thereof.

* * * * *